United States Patent
Schmidt et al.

(10) Patent No.: US 11,581,398 B2
(45) Date of Patent: Feb. 14, 2023

(54) METHOD OF FABRICATION OF AN INTEGRATED SPIRAL INDUCTOR HAVING LOW SUBSTRATE LOSS

(71) Applicant: LFOUNDRY S.R.L, Avezzano (IT)

(72) Inventors: Carsten Schmidt, Avezzano (IT); Gerhard Spitzlsperger, Avezzano (IT)

(73) Assignee: LFOUNDRY S.R.L

( * ) Notice: Subject to any disclaimer, the term of this patent is extended or adjusted under 35 U.S.C. 154(b) by 48 days.

(21) Appl. No.: 17/273,468

(22) PCT Filed: Sep. 6, 2019

(86) PCT No.: PCT/EP2019/073898
§ 371 (c)(1),
(2) Date: Mar. 4, 2021

(87) PCT Pub. No.: WO2020/049176
PCT Pub. Date: Mar. 12, 2020

(65) Prior Publication Data
US 2021/0249503 A1    Aug. 12, 2021

(30) Foreign Application Priority Data
Sep. 7, 2018 (EP) .................................. 18193297

(51) Int. Cl.
*H01L 49/02* (2006.01)
*H01L 21/768* (2006.01)
(Continued)

(52) U.S. Cl.
CPC ........ *H01L 28/10* (2013.01); *H01L 21/76898* (2013.01); *H01L 23/481* (2013.01);
(Continued)

(58) Field of Classification Search
CPC . H01L 28/10; H01L 21/76898; H01L 23/481; H01L 24/05; H01L 2224/05025;
(Continued)

(56) References Cited

U.S. PATENT DOCUMENTS 6,169,008 B1   1/2001   Wen
6,355,535 B2   3/2002   Liou
(Continued)

FOREIGN PATENT DOCUMENTS

CN   101110431 A * 1/2008   ....... H01L 21/76898

*Primary Examiner* — Mamadou L Diallo
(74) *Attorney, Agent, or Firm* — The Belles Group, P.C.

(57) ABSTRACT

After finishing of the front side CMOS manufacturing process, the silicon wafer is permanently bonded with its front side onto a carrier wafer. The carrier wafer is a high resistivity silicon wafer or a wafer of a dielectric or of a ceramic material. The silicon substrate of the device wafer is thinned from the back side such that the remaining silicon thickness is only a few micrometers. In the area dedicated to a spiral inductor, the substrate material is entirely removed by a masked etching process and the resulting gap is filled with a dielectric material. A spiral inductor coil is formed on the backside of the wafer on top of the dielectric material. The inductor coil is connected to the CMOS circuits on the front side by through-silicon vias.

16 Claims, 17 Drawing Sheets

(51) Int. Cl.
   *H01L 23/48*   (2006.01)
   *H01L 23/00*   (2006.01)

(52) U.S. Cl.
   CPC .... *H01L 24/05* (2013.01); *H01L 2224/05025* (2013.01); *H01L 2924/19042* (2013.01)

(58) Field of Classification Search
   CPC ........... H01L 2924/19042; H01L 24/92; H01L 24/29; H01L 24/32; H01L 24/83; H01L 2224/05082
   See application file for complete search history.

(56) References Cited

U.S. PATENT DOCUMENTS

| | | | |
|---|---|---|---|
| 6,437,418 B1 | 8/2002 | Ferrari et al. | |
| 6,922,127 B2 | 7/2005 | Zou et al. | |
| 7,105,420 B1 | 9/2006 | Chan et al. | |
| 7,255,801 B2 | 8/2007 | Chen | |
| 8,324,692 B2 | 12/2012 | Chen et al. | |
| 8,427,266 B2 | 4/2013 | Wu | |
| 8,559,186 B2 | 10/2013 | Jin | |
| 9,883,590 B2 | 1/2018 | Huang | |
| 10,535,635 B2 * | 1/2020 | Chen | H01L 23/528 |
| 10,811,398 B2 * | 10/2020 | Kao | H01L 23/528 |
| 2008/0020488 A1 | 1/2008 | Clevenger et al. | |
| 2009/0283866 A1 * | 11/2009 | Schulze | H01L 29/36 257/E21.135 |
| 2010/0225436 A1 * | 9/2010 | Papavasiliou | H01L 23/481 336/200 |
| 2011/0304013 A1 * | 12/2011 | Chen | H01L 27/13 257/E21.022 |
| 2014/0036462 A1 * | 2/2014 | Wang | H01L 23/645 29/852 |
| 2014/0367777 A1 * | 12/2014 | Huang | H01L 29/7816 438/459 |
| 2017/0084531 A1 * | 3/2017 | Gu | H01L 21/76895 |
| 2017/0201291 A1 * | 7/2017 | Gu | H01L 27/1203 |

* cited by examiner

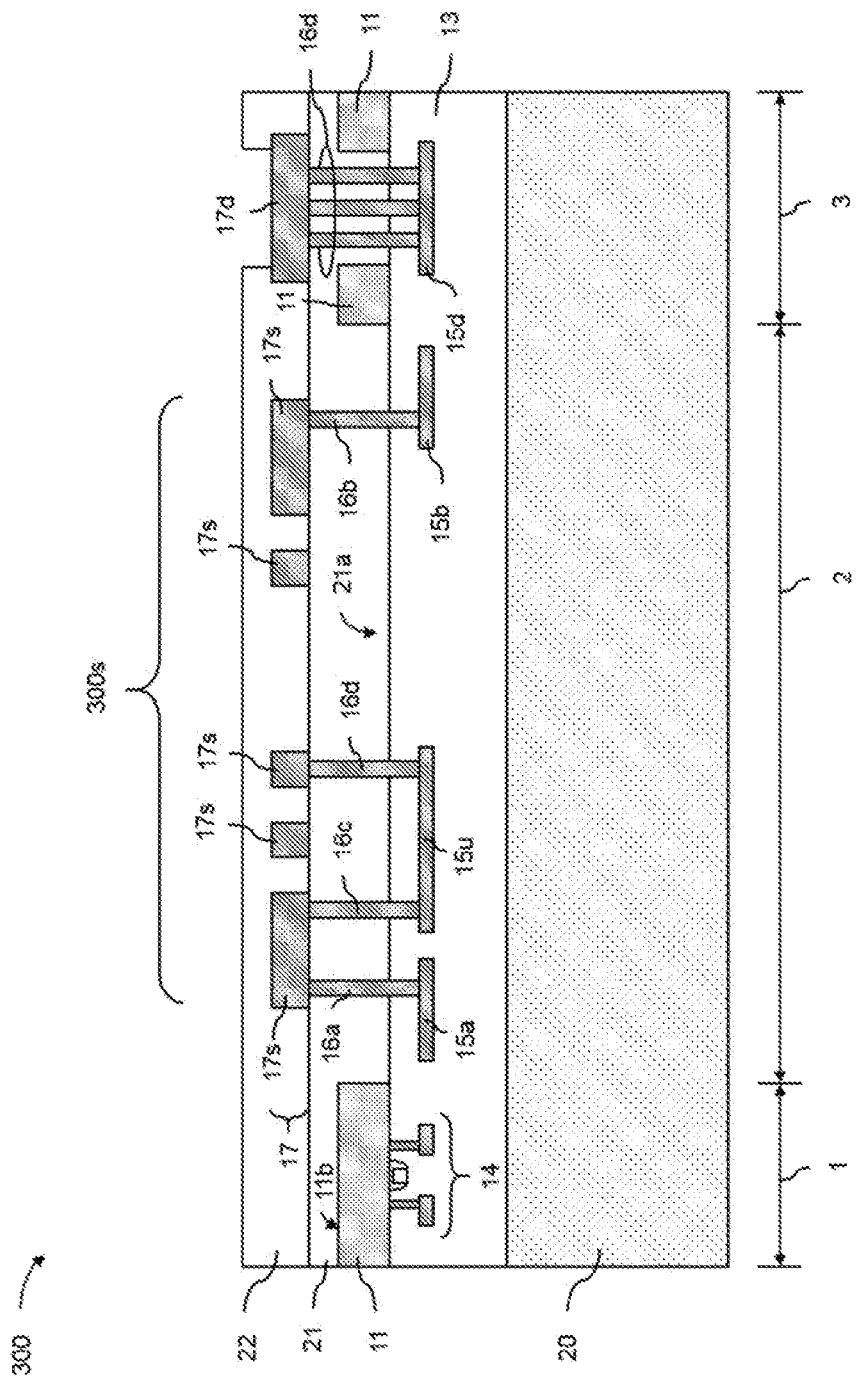

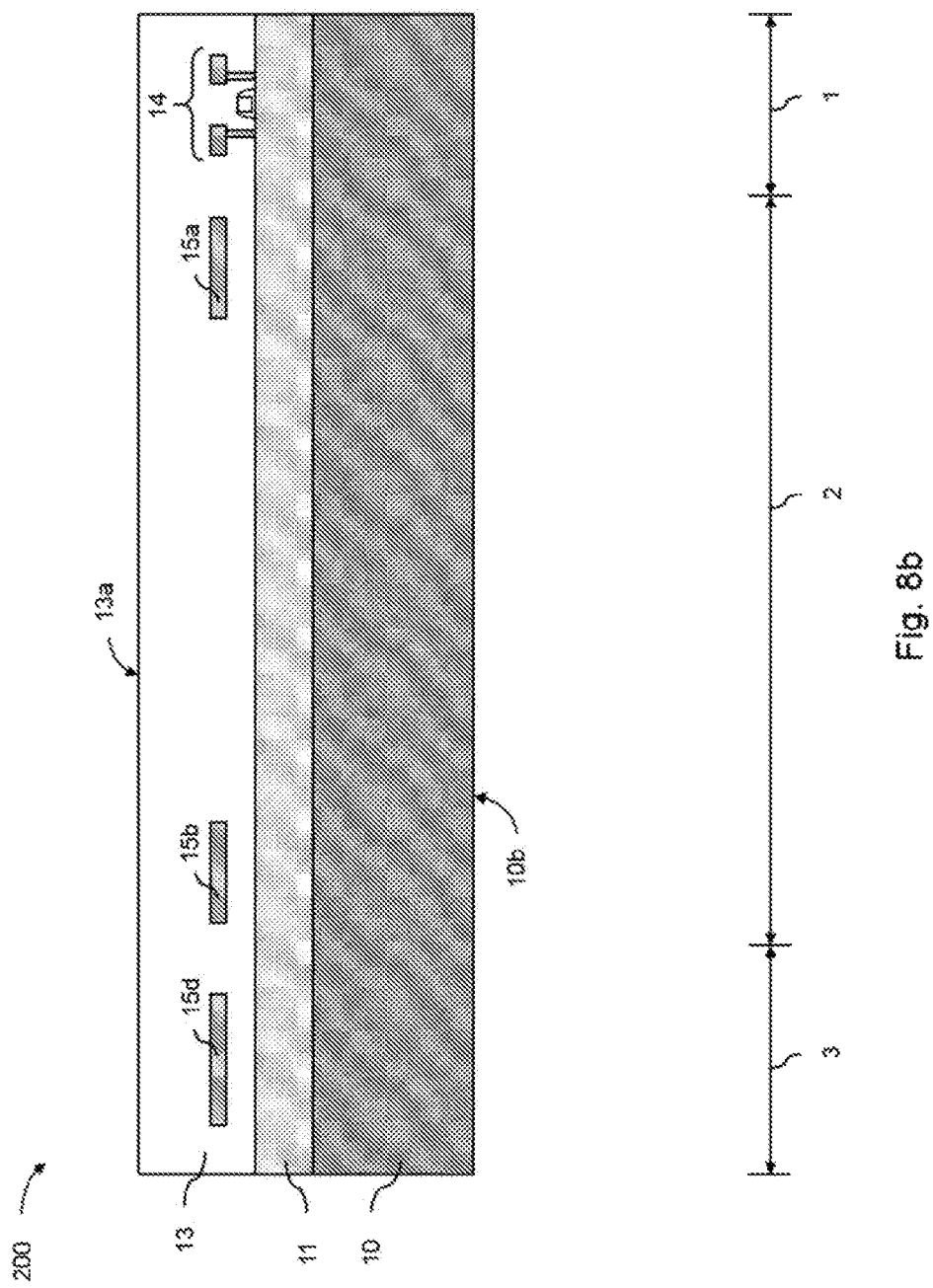

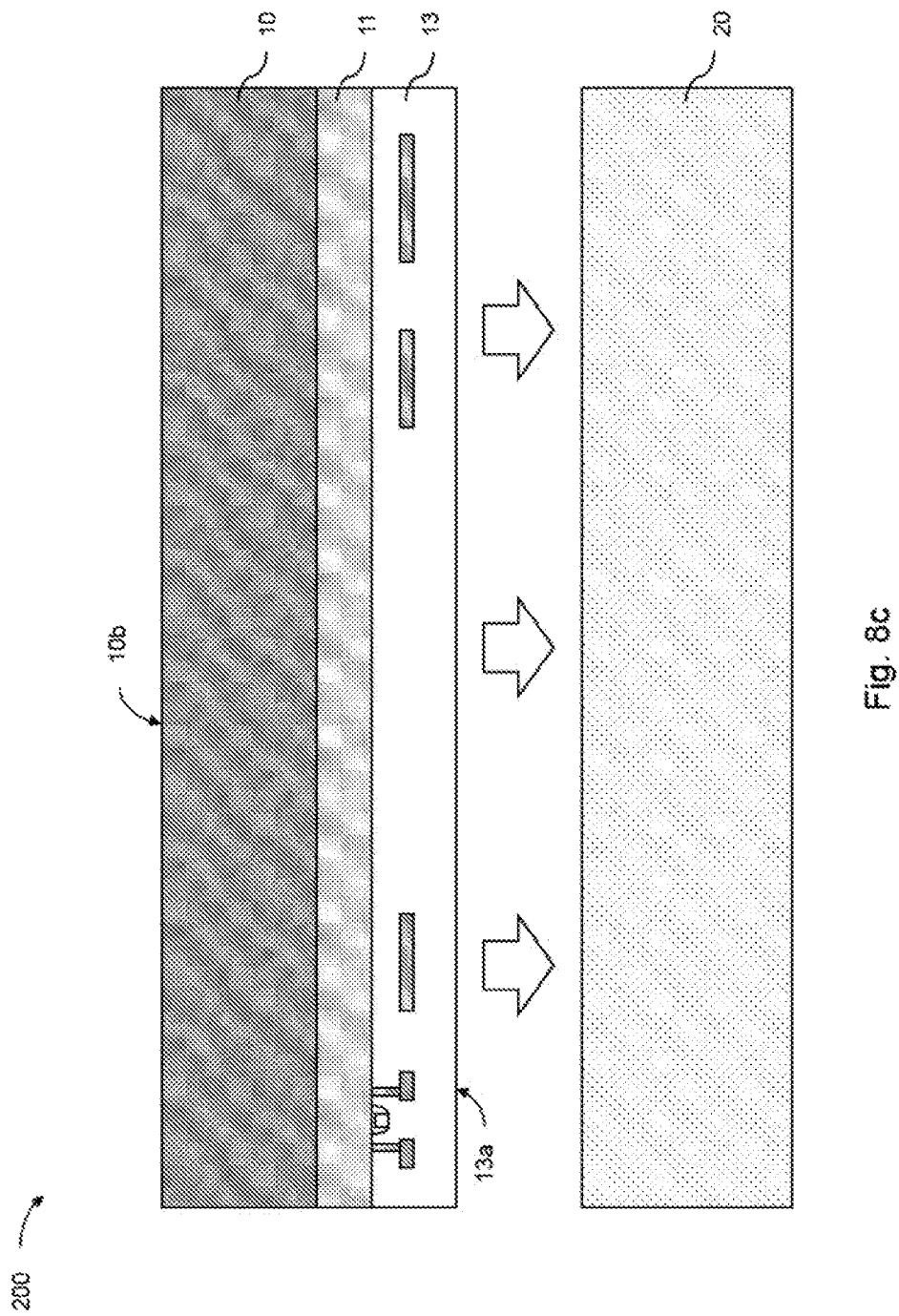

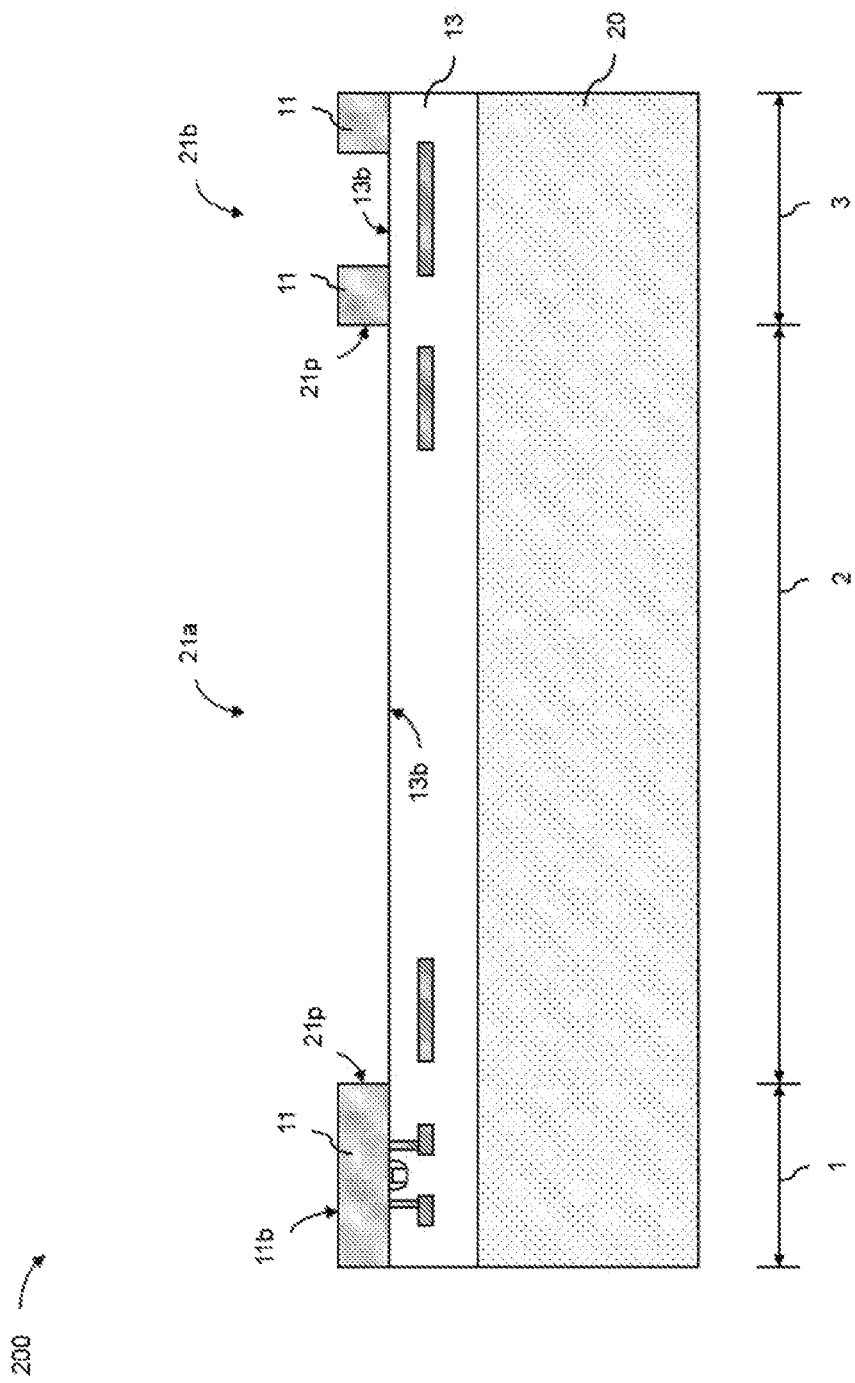

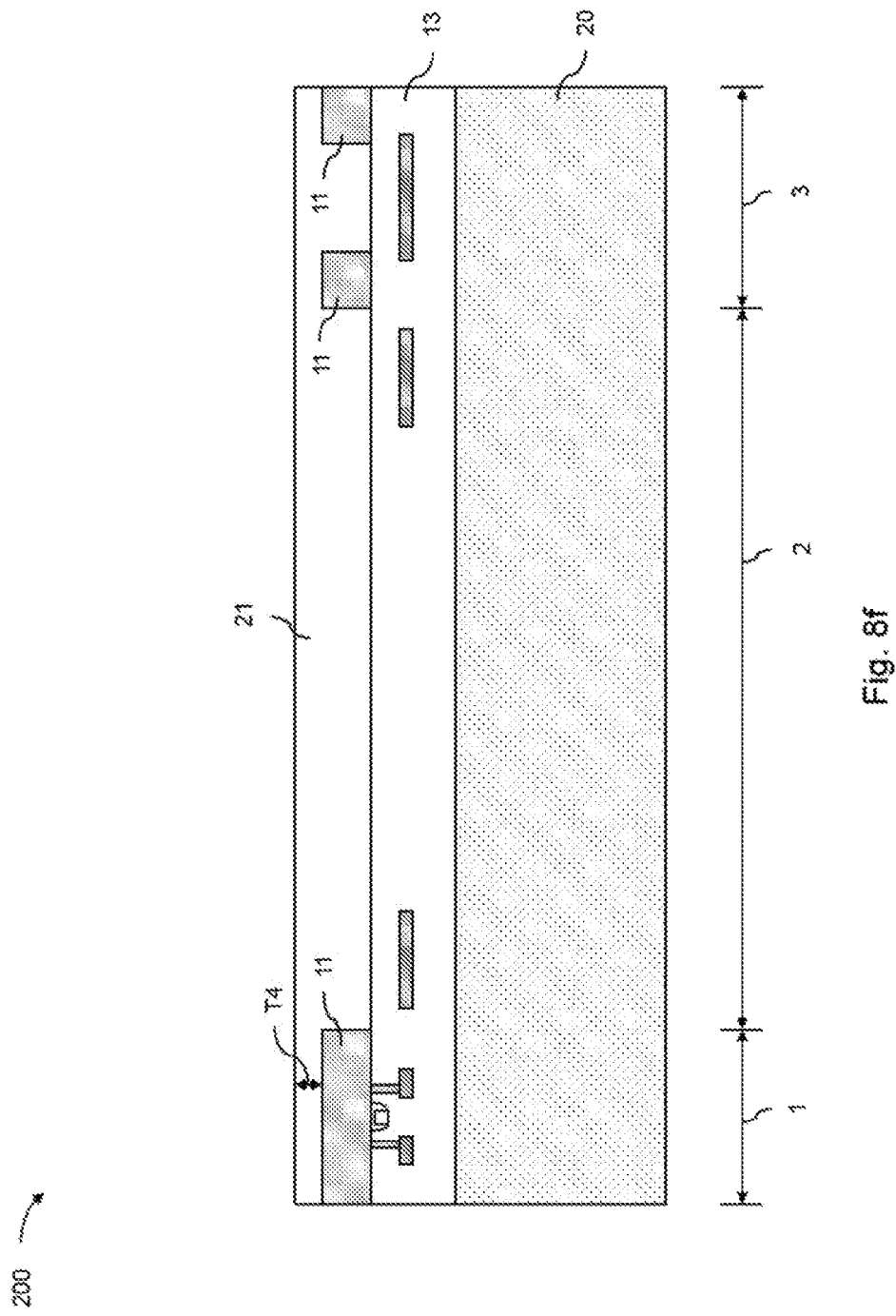

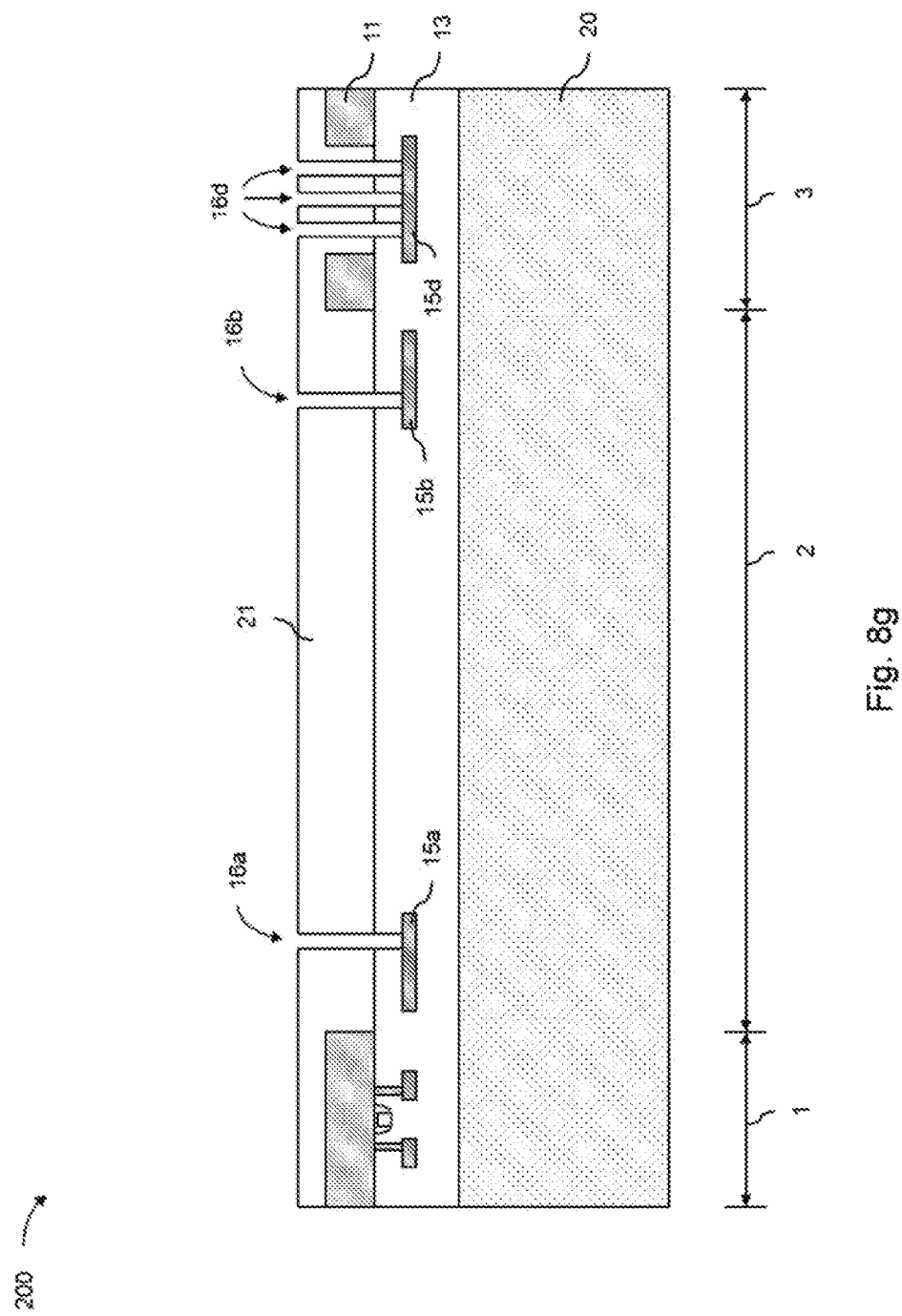

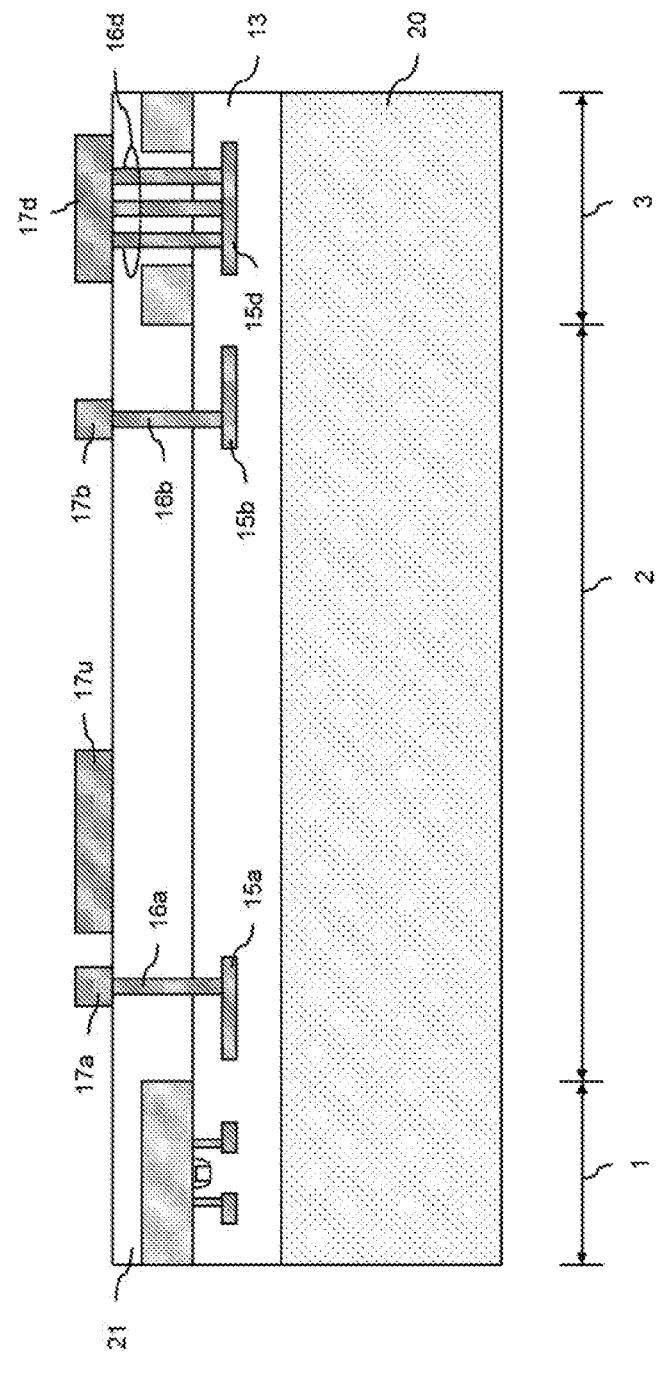

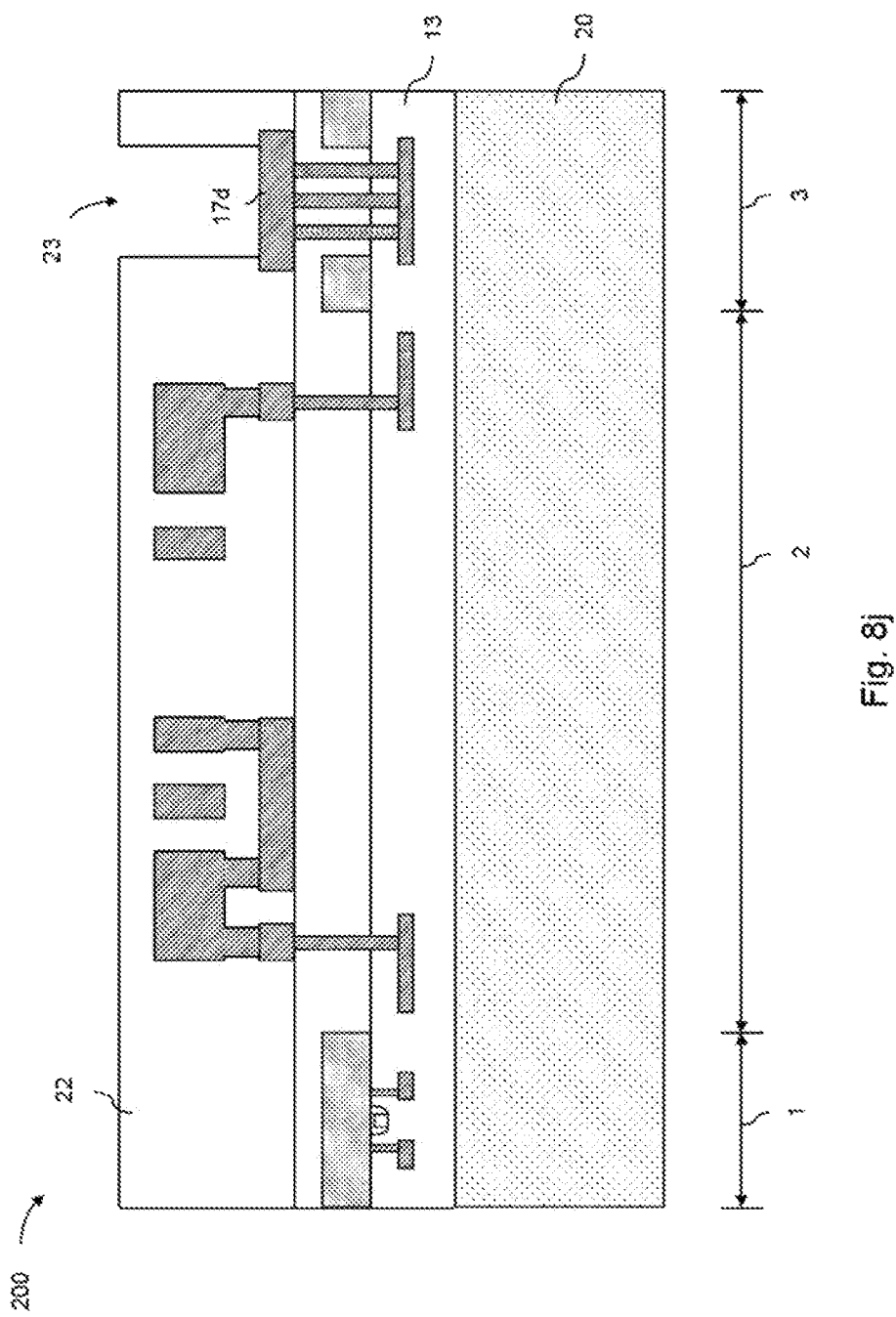

METHOD OF FABRICATION OF AN INTEGRATED SPIRAL INDUCTOR HAVING LOW SUBSTRATE LOSS

CROSS-REFERENCE TO RELATED PATENT APPLICATIONS

The present application is a U.S. national stage application under 35 U.S.C. § 371 of PCT Application No. PCT/EP2019/073898, filed Sep. 6, 2019, which claims priority from European Patent Application No. 18193297.1, filed on Sep. 7, 2018, the entire disclosure of which is incorporated herein by reference.

TECHNICAL FIELD

The disclosure relates to a method of fabrication of an integrated spiral inductor with improved characteristic parameters like a high Q-factor, a high self-resonance frequency (SRF) and a reduced silicon area consumption. In particular, the disclosure relates to a method of fabrication of an integrated spiral inductor having a low substrate loss.

BACKGROUND

Modern Analog and Mixed-Signal (AMS) integrated circuit (IC) fabricated in CMOS technology adopt circuit components, like, for example, on-chip integrated inductors, to be used in various radio frequency (RF) circuit blocks such as Voltage-Controlled Oscillators (VCOs), Low-Noise Amplifiers (LNAs) and impedance networks.

Conventional inductors have spiral shape and are characterized by the following parameters: the inductance of the spiral turn, the Quality Factor (Q-factor) and the self-resonance frequency (SRF).

In particular, the Q-factor is an indicator of the performance of the inductor coil, measuring the ability of the inductor coil to store magnetic energy. A higher Q-factor value is an indication of the increase capacity to store magnetic energy and, of course, of the minor tendency to dissipate it. The Q-factor is defined as follows:

$$Q = 2\pi \cdot (\text{energy stored})/(\text{energy loss per cycle})$$

Generally, the Q-factor depends on different inductor design parameters, which affects the inductor's performance, in terms of loss of energy. In particular, the Q-factor is affected by the following limiting factors: the conduction loss, the substrate loss and the radiation loss. All of them depend on frequency. Especially at gigahertz frequencies, the substrate loss is typically the dominating loss factor.

Generally, the cause of the substrate loss is found in the generation of the parasitic capacitance between the inductor coil and substrate as well as on the resistance of the substrate. A conventional method used for preventing the loss of current in the silicon substrate includes increasing the resistivity of the silicon substrate. Another method includes the increasing of the distance between the inductor and silicon substrate surface.

The self-resonance frequency (SRF) is the frequency at which the parasitic capacitance of the inductor resonates with the ideal inductance of the inductor. The SRF limits the frequency range over which the inductor coil can be used. The SRF is typically reduced by parasitic capacitances such as the parasitic interwinding capacitance or the parasitic capacitance between the inductor coil and the substrate.

Various methods are known in the state of the art to reduce the substrate loss of a spiral inductor. By way of example, one method employs the insertion of a solid ground shield between the inductor coil and the silicon substrate to eliminate the impact of the lossy substrate. The shield effect can be achieved by using a doped polysilicon layer or a metal layer. The disadvantage is that a magnetically induced eddy current is generated in the solid ground shield, flowing opposite to the inductor current. The negative mutual coupling lowers the inductance of the spiral inductor and thus the Q-factor.

For example, according to the U.S. Pat. Nos. 8,559,186 B2, 8,427,266 B2 and 9,883,590 B2, a patterned ground shield can be inserted between the inductor coil and the silicon substrate. The patterned ground shield shields the lossy substrate and is patterned in a way that the creation of eddy currents in the patterned ground shield is largely suppressed. A moderate increase of the Q-factor can be accomplished. A disadvantage of the use of the patterned ground shield is the generation of an additional parasitic capacitance lowering the SRF and thus the frequency application range of the inductor coil.

Another method uses the insertion of a thick dielectric layer, for example an oxide or polyimide layer, between the spiral inductor and the substrate. In this case, the inductor is placed on the thick polyimide layer, which is disposed on top of the uppermost CMOS metal stack. The parasitic capacitance to the substrate is reduced. The disadvantage of this method is that it requires some additional process steps, which are not part of the standard CMOS fabrication process.

For example, according to U.S. Pat. No. 6,169,008 B1, a method comprising the step of etching a trench into the silicon substrate and filling it with amorphous silicon or dielectric material is disclosed. According to this method, the spiral inductor is formed above the trench.

For example, the U.S. Pat. No. 8,324,692 B2 discloses an alternative method comprising the formation of a cavity in the intermetal dielectric stack underneath the inductor coil. The parasitic capacitance between the inductor coil and the substrate is lowered by the reduced effective dielectric constant associated with the cavity.

Similar approaches for achieving a high Q-factor for a spiral inductor are disclosed in US patents: U.S. Pat. Nos. 7,105,420 B1; 7,255,801; 6,437,418 B1 and 6,355,535 B2.

According to another method, the reducing of the substrate loss is achieved by selectively removal of the silicon material underneath the inductor by using micromachining process (see for example "*Large Suspended Inductors on Silicon and their use in a 2-µm CMOS RF Amplifier*", by Chang et al., IEEE Electron Device Lett., vol 14, pp. 246-248, May 1993; and "*High Q backside Micromachined CMOS Inductors*", by Ozgur et al., Proc. IEEE Intl. Symp. On Circuits and Systems, vol 2, pp 577-580, 1999). The Q-factor can effectively be improved by the use of this method, however, a disadvantage of using it resides in the arise of reliability issues like packaging yield loss and long-term mechanical stability.

Another method is disclosed in the U.S. Pat. No. 6,922,127 B2. According to this disclosed method the inductor is lifted from the substrate during a final step of the manufacturing process. Due to the vertical orientation of the inductor coil the substrate loss becomes small and moreover, the silicon area consumption is reduced. As in the previous case, this method can trigger reliability issues like packaging yield loss and long-term mechanical stability.

In order to overcome the technical problems associated with the prior art methods described in the foregoing, there is a desire to provide a method of fabrication of an integrated spiral inductor having improved characteristic parameters, such as an improved Q-factor, a higher self-resonance frequency (SRF), and a reduced silicon area consumption for a given inductance value. In particular, there is a desire to provide a method of fabrication of an integrated spiral inductor having low substrate loss.

SUMMARY

Exemplary embodiments of the method of fabrication of an integrated spiral inductor having improved characteristic parameters are specified in claims 1 to 17. Exemplary embodiment of a product device comprising an integrated spiral inductor manufactured according to the disclosed method is specified in claim 18.

For example, the method of fabrication according to the invention as discussed below includes: performing a standard front side CMOS manufacturing process on a first semiconductor wafer; permanently bonding a high resistivity carrier wafer (for example a high-ohmic silicon wafer or a wafer of a dielectric material such as glass or a wafer of a ceramic material such as sapphire) to the front side of the first semiconductor wafer; thinning the silicon substrate of the device wafer from the back side to a final thickness of few micrometers (less than 12 micrometers or preferably less than 3 micrometers); entirely removing the semiconductor substrate in the area dedicated to the spiral inductor by a masked etching process and filling the resulting gap with dielectric material (for example silicon oxide or a spin-on dielectric); forming the spiral inductor coil on the back side of the wafer on top of the dielectric material; connecting the inductor coil to the CMOS circuits on the front side by through-silicon vias (TSV) placed in the gap filled with dielectric material.

According to a first embodiment, the disclosed method of fabrication of an integrated spiral inductor having improved characteristic parameters comprises the following steps: providing a first semiconductor wafer having a semiconductor substrate (for example a silicon substrate or silicon epitaxial layer) with standard resistivity; disposing a multilevel isolation structure (for example dielectric layers) on the semiconductor substrate; forming metal wiring embedded in the multilevel isolation structure; flipping the wafer upside down and bonding permanently a carrier wafer having semiconductor substrate with high-resistivity value (for example a high resistivity silicon wafer, or a glass wafer, or glass-on-silicon wafer, or sapphire wafer) to the front side surface of the first wafer; partially thinning the semiconductor substrate of the first wafer from the backside; creating a gap by removing the semiconductor substrate from the area dedicated to the spiral inductor; filling the gap with dielectric material; forming a spiral inductor on top of the gap filled with dielectric material using at least one conductive layer (for example metal); forming through-silicon vias (TSV) disposed in the gap filled with dielectric material and spaced apart from the remaining silicon substrate; connecting the spiral inductor to the metal wiring of the front side of the substrate by the through-silicon vias (TSV).

According to another embodiment, the disclosed method of fabrication of an integrated spiral inductor having improved characteristic parameters comprises the following steps: providing a first semiconductor wafer having a semiconductor substrate (for example a silicon substrate or silicon epitaxial layer) with standard resistivity; disposing a multilevel isolation structure (for example dielectric layers) on the semiconductor substrate; forming metal wiring embedded in the multilevel isolation structure; flipping the wafer upside down and bonding permanently a carrier wafer having semiconductor substrate with high-resistivity value to the front side surface of the first wafer; partially thinning the semiconductor substrate of the first wafer from the backside; creating a gap by removing the semiconductor substrate from the area dedicated to the spiral inductor; filling the gap with dielectric material; forming a spiral inductor having more than one winding on top of the gap filled with dielectric material using at least two conductive layers (for example metal layers), wherein the first metal layer disposed on the dielectric layer is used for forming at least one underpass; forming through-silicon vias (TSV) disposed in the gap filled with dielectric material and spaced apart from the remaining silicon substrate; connecting the spiral inductor to the metal wiring of the front side of the substrate by the through-silicon vias (TSV).

According to another possible embodiment, the disclosed method of fabrication of an integrated spiral inductor having improved characteristic parameters comprises the following steps: providing a first semiconductor wafer having a semiconductor substrate (for example a silicon substrate or silicon epitaxial layer) with standard resistivity; disposing a multilevel isolation structure (for example dielectric layers) on the semiconductor substrate; forming metal wiring embedded in the multilevel isolation structure; flipping the wafer upside down and bonding permanently a carrier wafer having semiconductor substrate with high-resistivity value to the front side surface of the first wafer; partially thinning the semiconductor substrate of the first wafer from the backside; creating a gap by removing the semiconductor substrate from the area dedicated to the spiral inductor; filling the gap with dielectric material; forming a spiral inductor having more than one winding on top of the gap filled with dielectric material using one conductive layer (for example metal layer), wherein one or more metal layers provided on the front side of the substrate are used to form at least one underpass; forming through-silicon vias (TSV) connecting the at least one underpass to the spiral inductor; forming through-silicon vias (TSV) disposed in the gap filled with dielectric material and spaced apart from the remaining silicon substrate connecting the spiral inductor to the metal wiring of the front side of the substrate.

These and additional exemplary embodiments, features and advantages of the present invention will be set forth in the following detailed description and in part will be readily apparent to those skilled in the art by practising the embodiments as described in the written description and claims hereof, as well as in the appended drawings. It is to be understood that both the foregoing general description and the following detailed description are merely exemplary and are intended to provide an overview or framework to understand the nature and character of the claims.

BRIEF DESCRIPTION OF THE DRAWINGS

The accompanying drawings are included to provide a better understanding of the present invention and are incorporated in and constitute a part of the specification. The drawings illustrate one or more embodiments, and together with the detailed description serve to explain principles and operation of the various embodiments.

FIG. 7 is a schematic cross-sectional diagram of an integrated spiral inductor fabricated according to another possible embodiment of the present method.

FIGS. 8a to 8j show manufacturing steps of a method of manufacturing of the integrated spiral inductor according to a preferred embodiment.

DETAILED DESCRIPTION

Exemplary embodiments of the present invention will be discussed hereafter in further detail regarding a method of fabricating a high quality integrated spiral inductor having improved characteristic parameters like a higher Q-factor, a high self-resonance frequency (SRF) and a reduced substrate loss.

Figure 1:
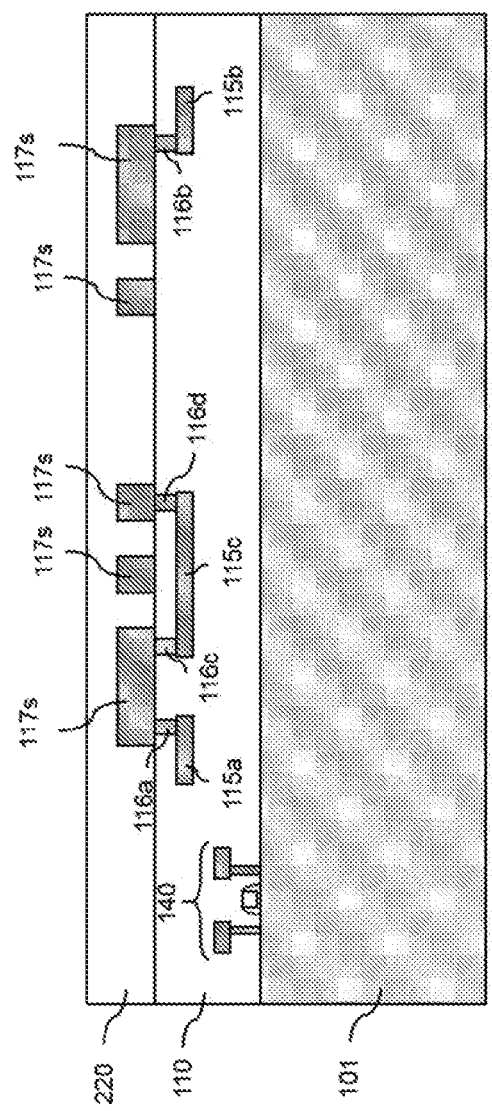
FIG. 1 is a schematic diagram of an integrated spiral inductor according to a prior art.

FIG. 1 is schematic cross-sectional view of a semiconductor IC device comprising an integrated spiral inductor according to prior art. CMOS devices and circuits are formed on a silicon substrate (101) which has the typical low resistivity used for CMOS fabrication. A MOS transistor (140) is depicted with gate and source/drain contacts (the wells and the gate contact are not shown) representing the plurality of CMOS devices formed in and on the substrate (101). A dielectric layer (110) (pre-metal and intermetal dielectric) is disposed on the silicon substrate and metal wiring is formed in the dielectric layer. An inductor (117s) is disposed on top of the dielectric layer (110). The inductor (117s) is a planar spiral coil (spiral inductor) created in a plane that is parallel to the plane to the surface of the substrate (100). The two ends (ports) of the spiral inductor (117s) are connected to the wiring by the vias (116a) and (116b). If the spiral inductor has more than one turn, an underpass (115c) is required. The underpass (115) is connected to the spiral inductor (117s) by means of the vias (116c) and (116d). Oftentimes, a thick extra metal layer is used to form the inductor coil on top of the standard CMOS wiring. The upmost CMOS standard metal layer is then used for the underpass. Finally, a passivation layer (220) such as polyimide is applied.

Figure 2:
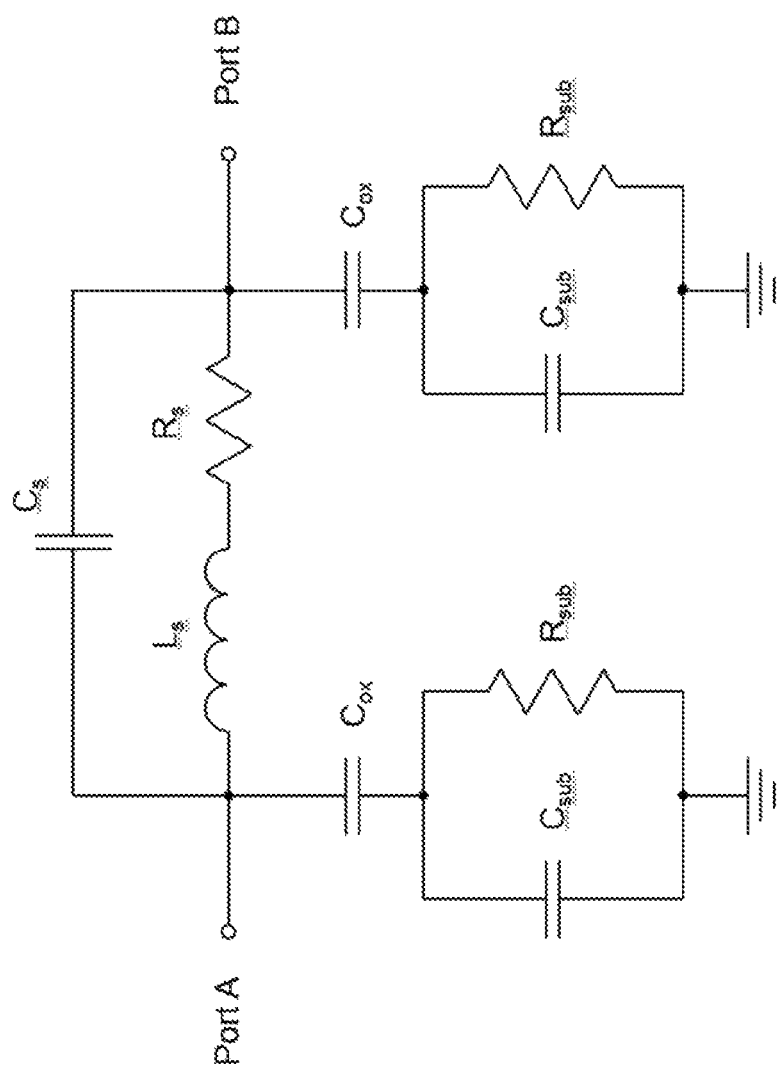
FIG. 2 shows a schematic diagram of the equivalent circuit of an integrated spiral inductor according to a prior art.

FIG. 2 shows a schematic diagram of the equivalent circuit of an integrated inductor coil of prior art. $L_s$ and $R_s$ represent the inductance and the series resistance of the inductor coil, respectively, $C_s$ is the parasitic interwinding capacitance of the inductor. $C_{ox}$ represents the parasitic capacitance between the inductor and the substrate. $R_{sub}$ and $C_{sub}$ represent the resistance of the substrate and the parasitic capacitance of the substrate, respectively.

An alternating current flowing through the spiral inductor induces an image current (eddy current) in the conductive substrate underneath according to Faraday's Law. In compliance with Lenz's Law, the image current is directed opposite to the current direction in the spiral inductor, resulting in a degradation of the inductance and thus in a lowering of the Q factor of the spiral inductor. The lower the resistance $R_{sub}$ of the substrate, the more pronounced the reduction of the Q factor.

To reduce the substrate loss of the inductor, it would be beneficial to use a substrate 100 with a high value of the resistance $R_{sub}$. However, a high-ohmic substrate is in many cases not suitable for the CMOS part of the product chip. Discrete inductors can be built on non-conductive substrates such as sapphire or on GaAs, however, they have high unit costs and high assembly costs.

To achieve a high Q-factor, it would also be desirable to reduce $C_{ox}$. The capacitive coupling of the spiral inductor to the substrate may also change the substrate potential and induce a displacement current by which the substrate loss is further increased. For an integrated spiral inductor, $C_{ox}$ is determined by the dielectric constant, the thickness of the dielectric layer and the size of the spiral inductor. Thickness and dielectric constant of the pre- and intermetal dielectric layers are usually given by the CMOS fabrication process and thus cannot easily be modified.

Typical values for the Q factor of the spiral inductor as shown in FIG. 1 are in the range of about 3 to 10. If a thick extra metal layer is added to the CMOS process flow for the creation of the spiral inductor, Q values of about 10 to 20 can be reached owing to the lower series resistance of the inductor.

Figure 3:
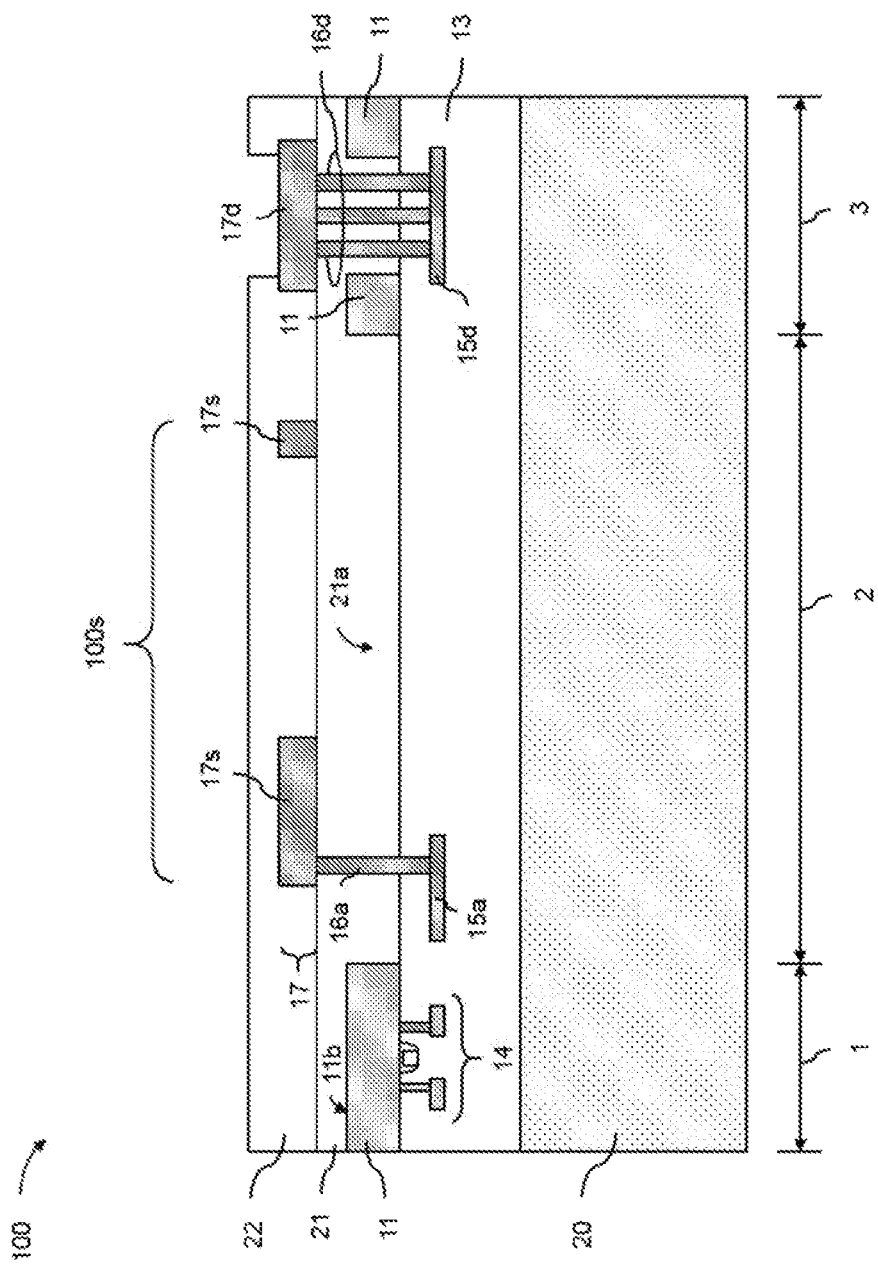
FIG. 3 is a schematic diagram of an integrated spiral inductor fabricated according to one embodiment of the present method.

FIG. 3 is schematic cross-sectional view of a semiconductor IC device comprising an integrated spiral inductor (100s) fabricated according to a first embodiment of the disclosed method. In the cross-sectional diagram of FIG. 3, three different areas, (1), (2) and (3), of a product chip (100) comprising an integrated spiral inductor are depicted. Area (1) denotes a CMOS circuit part of the product chip. Area (2) denotes the area of the product chip dedicated to the integrated spiral inductor. Area (3) denotes the input/output (I/O) part of the product chip. On the left side of the figure a MOS transistor (14) comprising gate and source/drain contacts is depicted. The MOS transistor (14) is formed on a portion of the substrate (11) and it represents the plurality of CMOS devices and circuits being formed on the substrate (11). The silicon substrate (11) has the typical resistivity used in CMOS fabrication. Shallow trench isolation (STI) can be used to isolate devices from each other, which is not shown in the figure. A typical CMOS metallization is formed comprising contacts, several metal layers and inter-metal vias. The layer (13), deposited as a multi-layer dielectric stack, comprises the pre- and inter-metal dielectrics. The metal pad (15a) provides a connection to one port of the spiral inductor. The metal pad (15d) provides connection to a bonding pad. The metal pads (15a) and (15d) can be formed by the first CMOS metal layer. As shown in FIG. 3, the substrate (11) with the MOS transistor (14) and the wiring formed in the dielectric layer (13) has been flipped and a carrier wafer (20) is bonded to the upper surface of the dielectric layer (13). The carrier wafer (20) has a high resistivity. According to one embodiment of the present invention, the carrier wafer (20) is a high-ohmic silicon wafer. In another embodiment, the carrier wafer is made of a dielectric material such as glass. In another embodiment, the carrier wafer is made of ceramic material such as sapphire ($Al_2O_3$). The silicon substrate (11) is thinned from the back side. The thickness of the substrate after thinning is less than 12 micrometers or preferably less than 3 micrometers. Moreover, as shown in FIG. 3, the remaining silicon substrate (11) is completely removed in the area 2 dedicated to the spiral inductor by a masked etching process. The resulting trench or gap in the substrate, denoted by (21a) in FIG. 3, is filled by the dielectric layer (21). The dielectric layer (21) is disposed also on the rear surface (11b) of the thinned substrate. A metal layer (17) is formed on the planarized surface of the dielectric layer (21). Through-silicon vias (TSV) (16a) and (16d) connect portions of the metal layer (17) formed on the back side with portions of the standard CMOS wiring formed on the front side of the chip. The TSVs are formed in the areas of the product chip where the substrate has been etched away and it has been replaced with dielectric material (21). In particular, the TSV (16a) is placed in the gap (21a). A spiral inductor (100s) having one winding is formed by the metal structure (17s) using metal layer (17). The spiral inductor is placed entirely within the area (21a) where the silicon substrate is removed. In the I/O part 3 of the product chip a bonding pad (17d) for external connections is formed using the metal layer (17) on the back side of the chip. The bonding pad (17d) is electrically connected to the wiring on the front side by means of the TSVs (16d). A passivation layer (22) is disposed thereon, which is opened over the bonding pad (17d) by mask/etch process.

Figure 4:
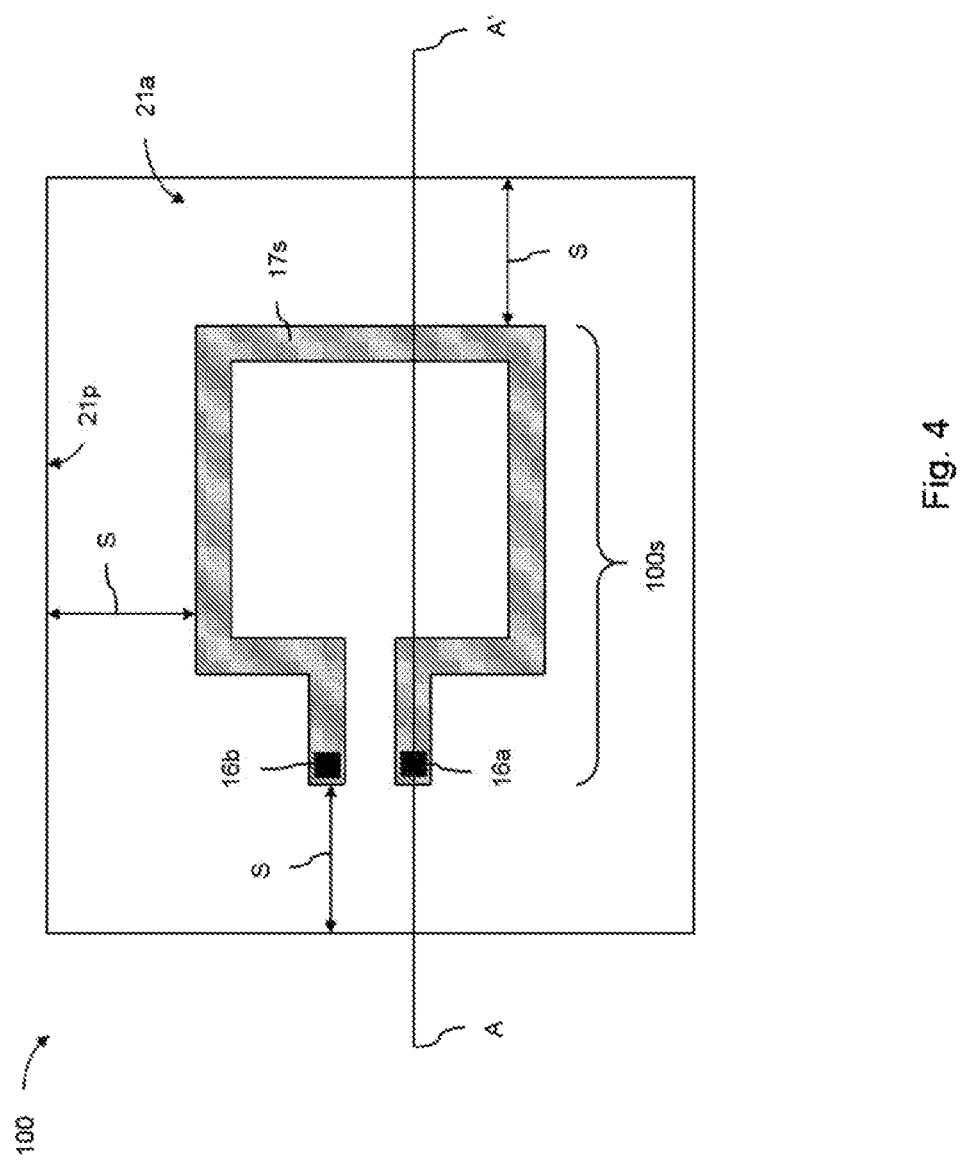
FIG. 4 is a schematic top view diagram of the integrated spiral inductor fabricated according to one embodiment of the present method.

Referring to FIG. 4, a schematic top view diagram of the spiral inductor (100s) of the product chip (100) is depicted. The line A-A' in FIG. 4 represents the cut direction of the cross-sectional diagram of the spiral inductor depicted in FIG. 3. The product areas (1) and (3) of FIG. 3 are not shown in the top view representation of FIG. 4. The shown spiral inductor (100s) has one winding, two ports and a rectangular shape. The two ports of the spiral inductor are connected to the CMOS circuit by the TSVs (16a) and (16b). The spiral inductor is formed on the dielectric layer (21) in the trench-etched area (21a). In this area the silicon substrate (11) is removed and the gap is filled with dielectric layer (21). S denotes the distance of the spiral inductor to the edge (21p) of the trench-etched area (21a). The distance S might be in the range of 10 micrometers to 500 micrometers. Please note that also the TSVs (16a) and (16b) have the distance S to remaining silicon substrate (11).

The spiral inductor formed in product chip (100) has rectangular shape. A skilled person will easily understand that the invention applies also to spiral inductors having a shape other than a rectangular shape, such as an octagonal shape, a hexagonal shape or a circular shape. Furthermore, the spiral inductor formed in product chip 100 has two ports. A skilled person will understand that the invention applies also to spiral inductors having more than two ports.

The spiral inductor (100s) shown in FIG. 3 and FIG. 4 has a low substrate loss, since the resistivity of the carrier wafer (20) has a high value. The resistivity of the carrier wafer (20) depends on the type of carrier substrate. According to one embodiment the carrier substrate (20) is a high-ohmic silicon wafer. The resistivity of the high-ohmic substrate can be in the range of 1 kOhm-cm to 10 kOhm-cm. According to another embodiment the carrier substrate is a glass wafer. According to a possible other embodiment, the carrier substrate is a glass-on-silicon wafer. According to this embodiment, the device wafer is bonded onto the glass side of the glass-on-silicon wafer. Before packaging, the silicon material of the glass-on-silicon carrier can be removed by back grinding. According to another possible embodiment, the carrier substrate is a ceramic wafer such as sapphire ($Al_2O_3$).

The spiral inductor (100s) shown in FIG. 3 and FIG. 4 has also a low substrate loss, since the low-ohmic silicon substrate (11) is completely removed in the area, where the spiral inductor is formed. Moreover, the spiral inductor is spaced apart by a distance S from any area of the product chip, where low-ohmic silicon substrate is present. In this way, the creation of an image current in the substrate (11) is largely suppressed.

The parasitic capacitance between the spiral inductor (100s) and the carrier substrate (20) is low owing to the large total dielectric thickness between the metal spiral (17s) on the back side and carrier wafer bonded onto the upper surface of the front side dielectric layer (13). The total dielectric thickness is given by the sum of the thickness of the dielectric layer (13), comprising the pre- and intermetal dielectric, and the thickness of the dielectric layer (21) inside of the gap (21a).

The parasitic capacitances between the TSVs (16a) and (16b) and the remaining silicon substrate (11) is low, since the TSVs are spaced apart by the distance S to the area, where silicon substrate is present.

Figure 5:
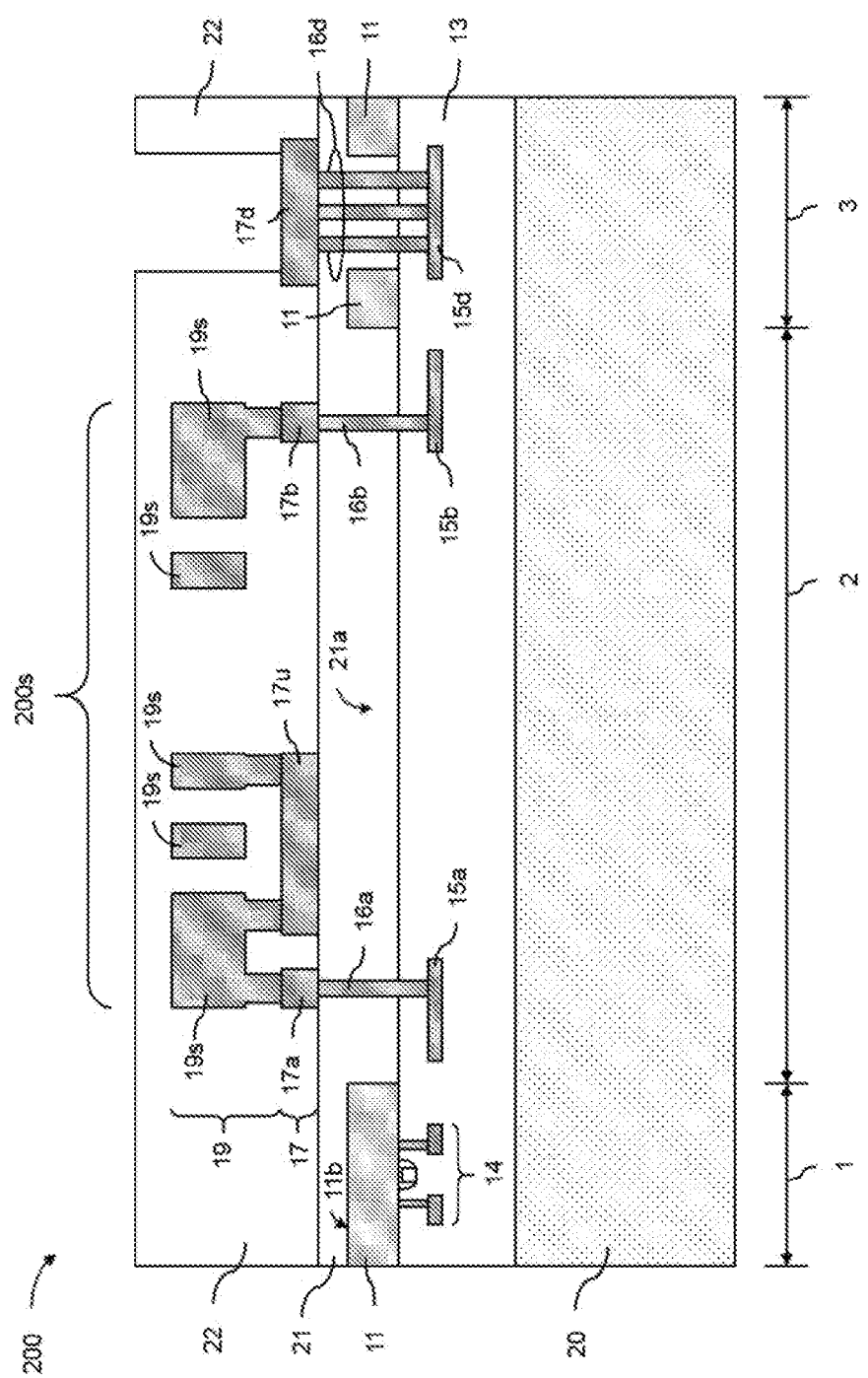
FIGS. 5 and 6 are cross-sectional and top down schematic diagrams of an integrated spiral inductor fabricated according to another embodiment of the present method.
Figure 6:
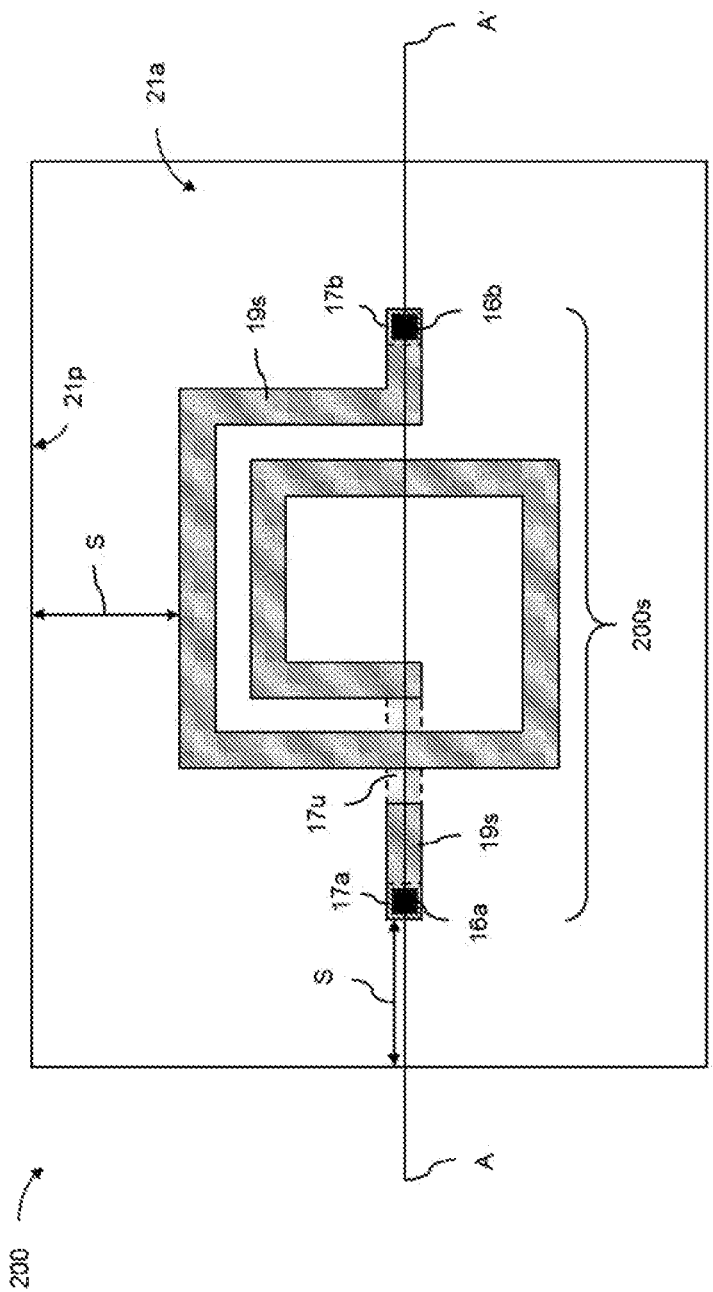

FIG. 5 and FIG. 6 are schematic diagrams of a product chip comprising the integrated spiral inductor fabricated according to another embodiment of the invention. As can be seen from the cross-sectional diagram depicted in FIG. 5, the product chip (200) differs from the product chip (100) in that two metal layers, denoted by (17) and (19), are formed on the back side. As in the previous embodiment, the spiral inductor is placed within the area (21a), where the silicon is removed, and where the resulting gap is filled with dielectric material (21). The spiral inductor (200s) comprises the metal spiral (19s) formed by the second metal layer (19). The spiral inductor may have more than one winding. As shown in FIG. 5, an underpass (17u) is provided by the first metal layer (17) on the backside. The multi-level metal structure (15a), (16a) and (17a) provides a connection from the standard CMOS wiring formed on the front side to the first port on the spiral inductor formed on the back side. The multi-level metal structure (15b), (16b) and (17b) provide a connection from the standard CMOS wiring formed on the front side to the second port on the spiral inductor. First and second metal layer on the back side are formed in a passivation layer (22), which can be made of silicon oxide or polyimide layer. The passivation layer (22) has an opening in correspondence to the bonding pad for the external connection of the product chip.

Referring to FIG. 6 a schematic top view diagram of the spiral inductor of product chip (200) is shown. The line A-A' in FIG. 6 represents the cross-sectional cut direction of the spiral inductor of FIG. 5. The exemplary spiral inductor (200s) of the product chip (200) has one and a half windings. The underpass (17u) as well as the port connections (16a), (17a) and (16b), (17b) are shown. The spiral inductor is formed in the trench-etched area (21a). In this area the silicon substrate (11) has been removed and the resulting gap has been filled with dielectric (21). S denotes the distance of the spiral inductor to the edge (21p) of the trench-etched area (21a). As in the previous embodiment, the distance S is in the range of 10 micrometers to 500 micrometers. Please note that also the TSVs (16a) and (16b) have the spacing S to remaining silicon (11).

The spiral inductor formed in product chip (200) has one and a half windings. A person skilled in the art will easily understand that the invention applies also to spiral inductors having more than one and a half windings. The spiral inductor formed in product chip (200) has rectangular shape. A person skilled in the art will easily understand that the invention applies also to spiral inductors having a shape other than a rectangular shape, such as an octagonal, hexagonal or circular shape. Furthermore, the spiral inductor formed in product chip (200) has an asymmetric design. A person skilled in the art will easily understand that the invention applies also to spiral inductors having a symmetric design. Furthermore, the spiral inductor formed in product chip (200) has two ports. A skilled person will understand that the invention applies also to spiral inductors having more than two ports. The inventors appreciate that spiral inductors having a circular shape and a symmetric design can offer enhanced Q-factors.

FIG. 7 is a schematic cross-sectional diagram of a product chip comprising the integrated spiral inductor fabricated according to another embodiment of the invention. As in the first embodiment depicted in FIG. 3 and FIG. 4, the spiral inductor integrated in product chip (300) is formed by only one metal layer (17) disposed on the back side. Unlike the first embodiment, the spiral inductor (300s) is assumed to have more than one winding. The required underpasses are formed by the metal layers formed on the front side and embedded in the multi-layer dielectric (13). As depicted in FIG. 7, the underpass (15u) is created by the first metal layer on the front side of the product chip. The underpass is connected to two ends of the metal spiral (17s) by the TSVs (16c) and (16d). As is easily understood by someone skilled in the art, more than one metal layer on the front side could be used to form the underpass. The more than one metal layer used for underpass are shorted by interconnecting vias. The more the metal layers are used to form the underpass, the lower the series resistance of the underpass. However, the more metal layers are used to form the underpass, the higher also the parasitic capacitance between the underpass and the carrier substrate (20).

The characteristic feature of the exemplary embodiment shown in FIG. 7 is that a spiral inductor having more than one winding is formed on the back side with only one metal layer disposed thereon. Compared to the second embodiment of forming a spiral inductor on the back side with two metal layers, there is typically a cost advantage. Moreover, the parasitic capacitance between the underpass and the inductor coil can be low owing to the large thickness of the dielectric layer (21) inside of the gap (21a).

Referring to FIG. 8a to FIG. 8j. the method of fabrication of the product chip (200) comprising the integrated spiral inductor having low substrate loss according to one embodiment of the present invention, is disclosed. It has to be noted that, as may be easily understood by a skilled in the art, the method of fabrication according to this embodiment do not differ substantially from the methods of fabrication of the product chip (100) and (300) according to the other exemplary embodiments of the invention.

Figure 8A:
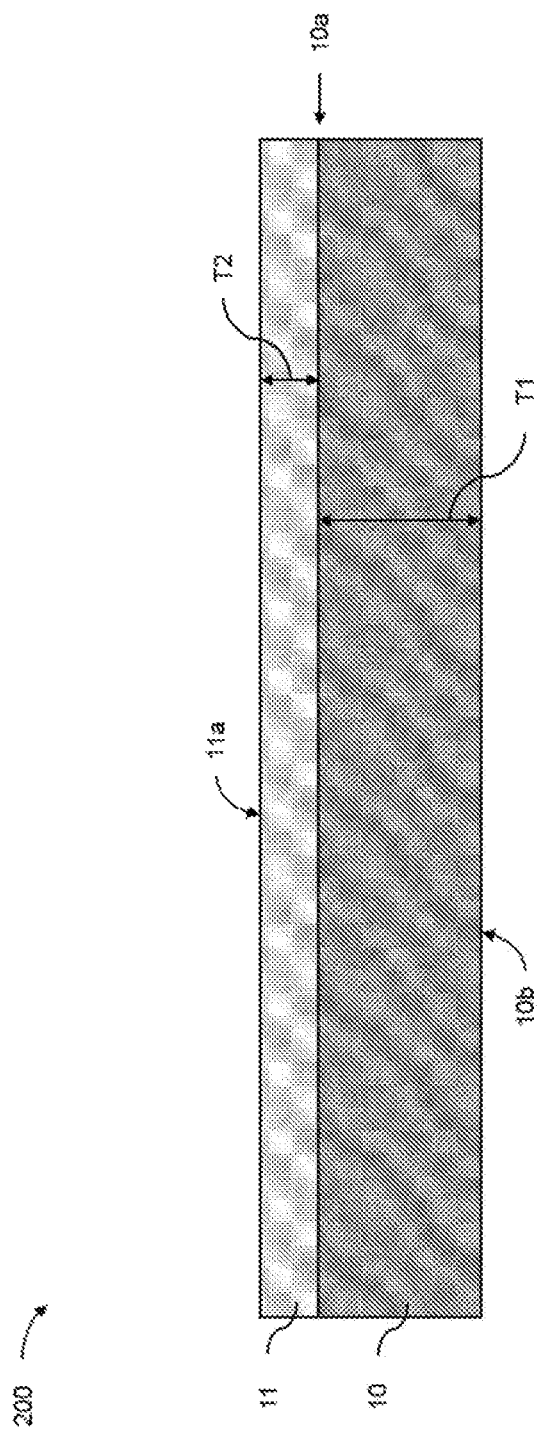

According to this embodiment of the invention, in FIG. 8a a silicon substrate (10) having a silicon epitaxial layer (11) is provided, said silicon substrate (10) having a first surface (10a) and second surface (10b). The first surface (10a) and the second surface (10b) are parallel to each other. The silicon substrate is heavily doped and has a thickness T1, which is in the range of several hundreds of micrometers. For instance, the thickness T1 of a silicon substrate might be between 500 micrometers and 800 micrometers. The silicon epitaxial layer is grown on the first surface (10a). The silicon epitaxial layer has a low doping level, suitable for the formation of CMOS devices. The resistivity of the silicon epitaxial layer may be in the range of 1 Ohm-cm to 100 Ohm-cm, and preferably in the range of 10 Ohm-cm to 20 Ohm-cm. The thickness T2 of the epitaxial layer (11) is less than 15 micrometers, and preferably less than 6 micrometers. Both, the substrate and the epitaxial layer may be p-type doped regions, but n-type doping is also possible for both.

According to another embodiment of the disclosed method of fabrication, a semiconductor substrate without any epitaxial layer grown on its first surface may be used. In that case, the resistivity of the semiconductor substrate is chosen such that it is suitable for the formation of CMOS devices on the first surface (10a).

According to another possible embodiment, a silicon-on-insulator (SOI) substrate could be used as well. In this case the silicon disposed on the buried oxide (BOX) has the resistivity which is suitable for the formation of CMOS devices. The thickness of the silicon formed on BOX may be less than 3 micrometers. The silicon carrier of the SOI substrate may have any resistivity.

According to a further embodiment of the invention, the semiconductor substrate may also have a SiGe epitaxial layer grown on the first surface (10a). Other substrate choices could be conceived without departing from the scope of the present invention.

In FIG. (8b), three different silicon substrate areas of the product chip are indicated by (1), (2), and (3). Area (1) denotes the substrate area of the chip in which CMOS devices and circuits are formed. Area (2) denotes the substrate area dedicated to the spiral inductor. Area (3) denotes a substrate area used for the I/O circuit in which also the bonding pads for external connections are provided.

On the right side of FIG. 8b, a MOS transistor (14) is depicted. The depicted MOS transistor (14) represents the multiple devices and circuits which are formed on the silicon epitaxial layer (11) in silicon area 1. Preferably, a shallow trench isolation (STI) structure, not shown in FIG. 8b, may be formed at the surface (11a) of the silicon epitaxial layer (11) to isolate devices from each other.

The multilayer dielectric stack (13) having a first surface (13a), comprises pre-metal and interlayer dielectric layer (PMD/ILD) in which the metal wiring of the circuits is formed. Typical materials used in multilayer dielectric stack are borophosphosilicate glass (BPSG), tetraethyl orthosilicate (TEOS), as well as porous and non-porous low-k dielectrics. The metal wiring comprises multiple metal layers and vias connecting the metal layers vertically. The metallization could be aluminum (Al) based or copper (Cu) based. For simplicity only one metal layer is shown in FIG. 8b). The metal layers (15a), (15b) and (15d) provide metal pads formed with at least one metal layer. No bonding pads are provided on the first side of the substrate for external connections of the product chip.

Referring to FIG. 8c, the substrate (10) is flipped upside down and a carrier substrate (20) is permanently bonded to the first surface (13a) of the multilayer dielectric stack (13). According to an embodiment of the invention the carrier substrate (20) can be a high-ohmic silicon substrate, whose electrical resistivity is preferably in the range of 1 kOhm-cm to 10 kOhm-cm. According to another embodiment of the invention, the carrier substrate (20) can be made of dielectric material (for example glass). According to another possible embodiment of the invention, a glass-on-silicon substrate can be used as well. According to a further possible embodiment, a ceramic substrate (for example $Al_2O_3$) can be used. Those skilled in the art can conceive other substrate choices which fulfill the same purpose.

One example of a bonding process is described as follows. The top surface (13a) of the dielectric multilayer stack is planarized. This is accomplished by depositing silicon oxide and by polishing the silicon oxide layer by chemical-mechanical polishing (CMP). To achieve a high planarity the steps of depositing silicon oxide and polishing the silicon oxide by CMP can be performed several times. After that the top surface is activated by plasma process with an inert gas. Then, the carrier substrate (20) is attached to the first planarized and plasma-activated surface (13a) of the dielectric stack by applying a suitable mechanical force or pressure. A low temperature bake is performed to strengthen the bonding. The temperature of the baking process may be in the range of 450° C. or lower. It is believed that the bonding between the two surfaces relies on Van-der-Waals forces. With this bonding method it is possible to bond a silicon oxide surface on a silicon surface of a high-ohmic silicon substrate. Also, it is possible to bond a silicon oxide surface on the surface of a glass or ceramic substrate. There are other bonding methods available that could be used. Some of them make use of adhesives by which a reliable bonding between the top silicon oxide surface of the device substrate and the carrier can be achieved.

Details of the described process are also disclosed in EP2913847B1, which is incorporated herein in its entirety, as reference.

Figure 8D:
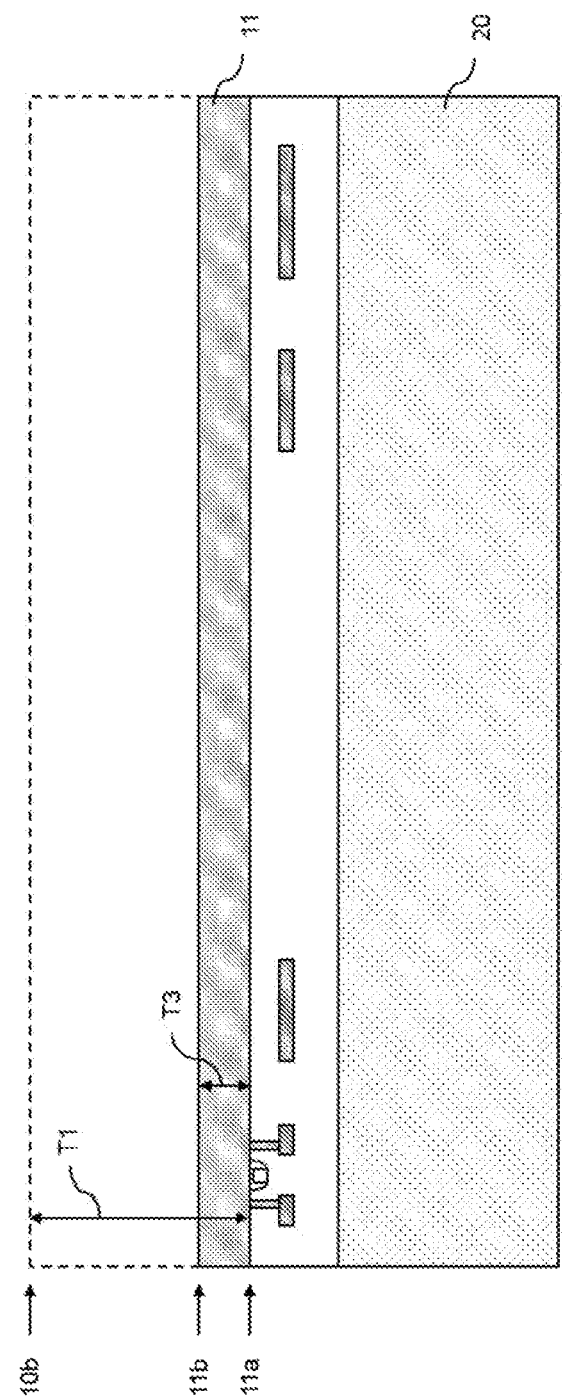

Using the carrier substrate (20) as mechanical support, the substrate (10) can be processed from the back side. As shown in FIG. 8d, starting at the second surface (10b), substrate material is removed. The substrate removal process may comprise back grinding, wet etching and/or chemical-mechanical polishing (CMP). One method to thin the silicon substrate down to a final thickness of only a few micrometers in a controlled and uniform manner is described below.

In a first step, the bulk of the highly doped silicon material is removed by back grinding. The back grinding is stopped before the low-doped epitaxial layer (11) is reached. In the second step a silicon wet etch is performed which stops selectively on the low-doped epitaxial layer owing to the difference in the doping densities of the highly doped silicon substrate (10) and the silicon epitaxial layer (11). In the third step a chemical-mechanical polishing (CMP) is performed to reduce the silicon roughness after the wet etching step. As the chemical-mechanical polishing proceeds into the silicon epitaxial layer (11), the final thickness T3 is lower than the initial thickness T2 of the epitaxial silicon layer. Depending on the initial thickness of the epitaxial layer, the final silicon thickness T3 might be less than 12 micrometers. More preferably, the final silicon thickness T3 is less than 3 micrometers.

If a low doped substrate without silicon epitaxial layer is used, the thinning process may comprise back grinding and chemical-mechanical polishing (CMP) only. Interferometric thickness measurements may be applied to ensure a proper control of the remaining silicon thickness T3. If a silicon-on-insulator substrate is used, the thinning process may comprise back grinding and a selective silicon wet etch followed by a wet removal of the BOX.

Further details of the described process are disclosed in EP2913847B1.

Referring to FIG. 8e, at least the trenches (21a) and (21b) are formed by masked dry-etch process, which stops selectively on the multilayer dielectric stack (13). The mask (not shown in FIG. 8e) could be a patterned photoresist or, preferably, hard mask made of silicon oxide or silicon nitride. Anisotropic Reactive Ion Etch (RIE) processes using gas chemistries such as $SF_6$—$O_2$, $SF_6$—HBr—$O_2$ or $SF_6$—$CHF_3$—$O_2$ are suitable for the silicon etch process as they can offer high etch rates as well as a high selectivity to the underlying dielectrics and the masking material. Such RIE processes are known to a skilled person. The masked dry-etch process removes the entire thickness T3 of the silicon epitaxial layer (11) exposing the dielectric surface (13b) at the bottom of the trenches. By the masked dry-etch process the trench gap (21a) is formed in the silicon epitaxial layer, having a bottom surface corresponding to the dielectric surface (13b) and a side surface (21p).

For proper alignment of the trench photo mask to structures formed on the front side (for example the shallow trench isolation structures, STI), alignment marks are required, which are created on the front side of the substrate and which are made visible on the back side of the substrate. There are several techniques available to a skilled person to accomplish such alignment marks.

The trench gap (21a) extends laterally over the entire silicon area (2) dedicated to the formation of the spiral inductor coil. In this way, the silicon epitaxial layer (11) is completely removed in the area (2), where the spiral inductor will be formed. At least a further trench (21b) is formed in the silicon area (3) dedicated for I/O part of the product chip.

Referring to FIG. 8f, a dielectric layer (21) is deposited on the back side, completely filling the trenches (21a) and (21b). The dielectric material has to be processed at a temperature not above 400° C. in order to not ruin the metallization formed on the front side. The dielectric material can be TEOS or a spin-on dielectric, for example spin-on glass (SOG), polyimide (PI), polybenzoxazole (PBO) or benzocyclobutene (BCB). Other options to fill the trenches with dielectric material are known to those skilled in the art. A chemical-mechanical polishing (CMP) process can be applied to planarize the dielectric layer (21). In that case, CMP process is stopped before the silicon of the epitaxial layer (11) becomes exposed. T4 denotes the thickness of dielectric material above the epitaxial layer. The thickness T4 may be small compared to silicon thickness T3, but not zero.

As shown in connection with FIG. 8g, vias (16a), (16b) and (16d) are etched from the back side by a photomask/dry-etch process. The vias (16a), (16b) and (16d) are etched through the entire dielectric layer (21), and into the multilayer dielectric stack (13). The via etching process stops selectively on the metal pads (15a), (15b) and (15d), which are formed with the front side metallization.

The masking material (not shown in FIG. 8g) can be patterned photoresist or metal such as TiN. While a photoresist mask is stripped typically directly after the etch process, a metal mask needs to be removed later in the process, for instance after the conductive fill of the vias (16a), (16b) and (16d). For the preferred thickness T3 of less than 3 micrometers, a photoresist mask is suitable to perform the via etching. The via etch mask has to be properly aligned to the metal landing pads (15a), (15b) and (15d) formed on the front side of the substrate. The proper alignment can be accomplished by creating alignment structures on the front side and by making them visible from the back side.

Referring to FIG. 8h, the vias (16a), (16b) and (16d) are filled with conductive material (for example Ti/TiN barrier and tungsten). After complete vias filling, the excess metal deposited on top of the dielectric layer (21) is removed by etch-back or CMP process. Alternatively, the conductive via filling material may include a Ta or Ta/TaN barrier and electroplated copper.

Such processes are commonly applied in front side metallization schemes and are known to a person skilled in the art.

A first metal layer, for example aluminum, is deposited on the upper surface of dielectric layer (21). The thickness of metal layer can be in the range of 1 micrometer to 6 micrometers. Metal structures (17a), (17b), (17u) and (17d) are formed by photomask/dry-etch process.

Metal structure (17d) denotes a bonding pad for external connections of the product chip. Bonding pad (17d) is placed on the vias 16d, which are electrically in contact with the metal pad (15d) formed on the front side of the substrate. By means of this structure, the electrical signals from the circuits on the front side become accessible on the back side, where the bonding pads are provided for external connections.

The metal structure (17a) is placed on the via (16a), which is in contact with the metal (15a) formed on the front side of the substrate. The metal structures (15a), (16a) and (17a) form together a first connection between the spiral inductor to be formed on the back side and the wiring on the front side.

In the same way, the metal structure (17b) is placed on the via (16b), which is in contact with the metal (15b) formed on the front side of the substrate. The metal structures (15b), (16b) and (17b) form together a second connection between the spiral inductor to be formed on the back side and the wiring on the front side.

The metal structure (17u) serves as an underpass for an inductor coil having more than one winding, as will become obvious in the following figures.

A passivation layer (not shown in FIG. 8h) can be deposited on the metal structures (17a), (17b), (17u) and (17d) and the exposed dielectric layer (21). The passivation layer might be silicon nitride or silicon oxynitride or a stack of silicon oxide and silicon nitride. The passivation layer may be opened above the bonding pad (17d). The passivation layer may further be opened above metal structures (17a), (17b) and (17u) at locations where these metal structures must be contacted from above.

The vias (16a), (16b) and (16d) are placed in trench-etched regions filled with the dielectric material (21). In this way, the vias are electrically isolated from each other and from the remaining silicon epitaxial layer (11). Particularly, the vias (16a) and (16b) are spaced apart from the silicon regions. In this way the parasitic capacitance between remaining substrate and the vias (16a) and (16b) is reduced.

Figure 8I:
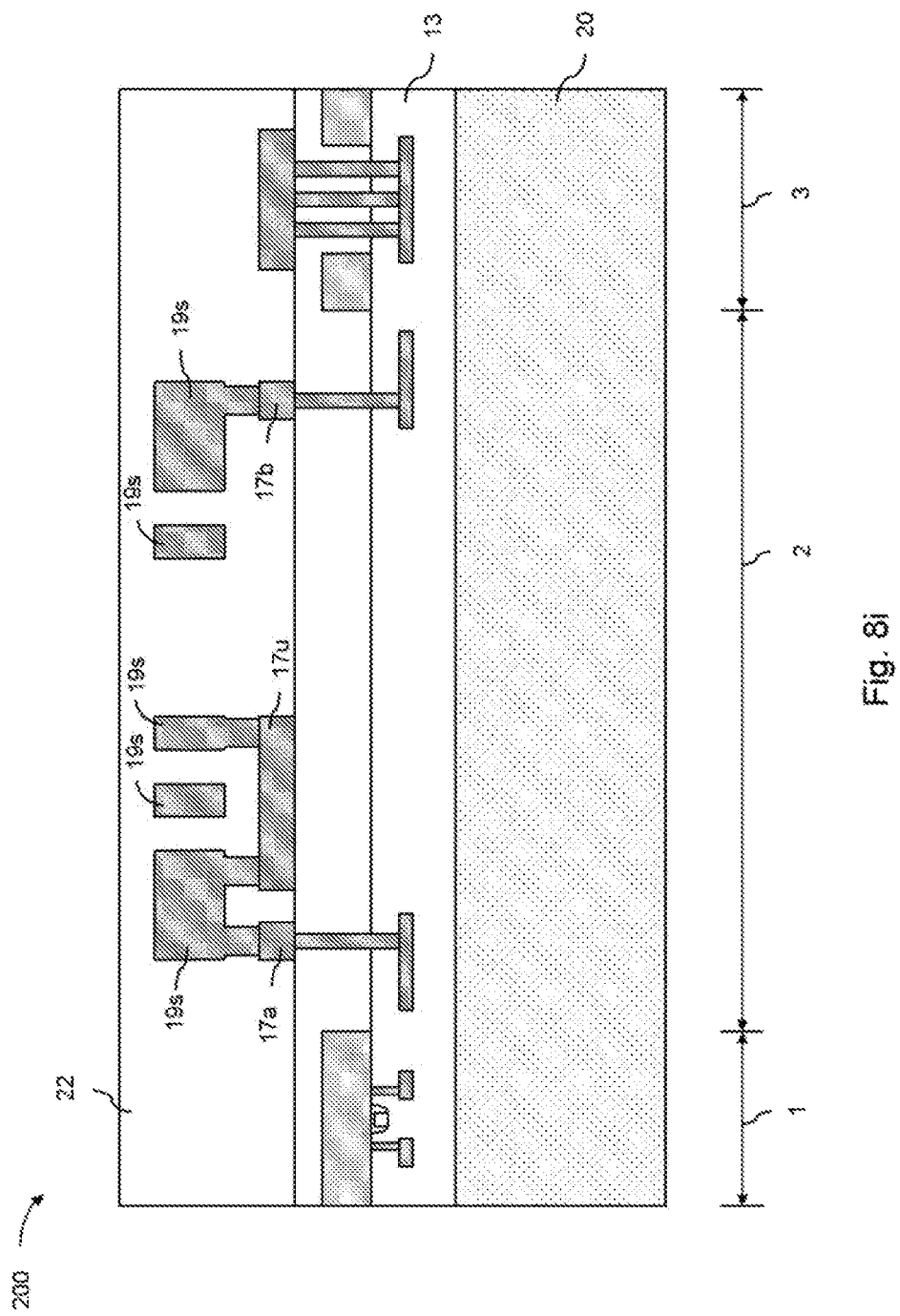

Referring now to FIG. 8i, the formation of the spiral inductor coil is completed. The spiral inductor comprises a second metal layer (19). The metal used for the spiral coil (19) may be Cu, Au or Al. Cu might be the preferred choice, since Cu has the lower value of the electrical resistivity ($1.68 \times 10^{-8}$ Ohm-m) compared to Au ($2.44 \times 10^{-8}$ Ohm-m) or Al ($2.65 \times 10^{-8}$ Ohm-m). The thickness of the metal layer (19) may be in the range of 3 micrometers to 30 micrometers, if Cu (or Au) is used. The thickness may be in the range of 4 micrometers to 8 micrometers, if Al is used.

According to one possible Cu-based process, the spiral inductor (19) is formed using a dual-damascene process. In this case, the layer (22), in which the spiral inductor is formed, may be silicon oxide or a low-k dielectric. Dual-damascene processes are commonly used in Cu-based interconnect schemes applied on the front side of the wafer.

Alternatively, the spiral inductor (19) may be formed using a re-distribution layer process. In this case, the layer (22) denotes a spin-on dielectric such a polyimide (PI). The metal could be Cu or Au. A re-distribution layer process is a typical mid-end-of-line (MEOL) process applied in wafer-level chip-scale assembly and packaging. Re-distribution layer processes are known to a person skilled in the art.

The dielectric layer (22) serves as passivation of the spiral inductor. A dielectric material having a low dielectric constant is preferred to reduce the parasitic interwinding capacitance of the spiral inductor.

Referring to FIG. 8j, a hole (23) is opened in the dielectric layer (22) above the bonding pad (17d). In this way, the bonding pad can be accessed for external connections of the finished product chip (200).

It is to be appreciated that there are various advantages associated with the present method of the invention for fabricating an integrated spiral inductor, having improved characteristic parameters, like higher Q-factor and low substrate loss. For instance, in the disclosed method the CMOS devices are still formed on a standard semiconductor substrate or on a silicon epitaxial layer with a low resistivity, while the substrate loss of the integrated spiral inductor fabricated on the backside of the device wafer according the present method is substantially reduced by replacing the substrate in the region underneath the inductor coil by oxide layer or other dielectric material. A further advantage obtained by removing the silicon substrate in the area in which the inductor coil is fabricated, is that the noise coupling between the inductor coil and the device silicon, which is substantial at gigahertz frequencies, is largely suppressed.

Furthermore, the substrate loss associated with the carrier wafer, which is permanently bonded to the device wafer to initiate the backside part of the manufacturing process, depends on its resistivity and on the thickness of the dielectric stack in between the inductor coil and the carrier wafer. In the case of a glass or sapphire carrier wafer the substrate loss related to the carrier can be virtually zero.

Moreover, the disclosed method may also simplify the modelling of the integrated inductor coil, by reducing the parasitic capacitances.

The invention claimed is:

1. A method of forming an integrated spiral inductor having low substrate loss, said method comprising the following operations:
    providing a semiconductor wafer having a semiconductor substrate, said semiconductor substrate having a first surface and a second surface, the first and second surfaces disposed on opposite sides of the substrate;
    disposing a multilayer isolation structure on said first surface;
    forming metal wiring embedded in the multilayer isolation structure;
    providing a high resistivity carrier wafer and attaching the carrier wafer to said semiconductor wafer so that the first surface of said semiconductor substrate faces towards the carrier wafer;
    thinning said semiconductor substrate from said second surface;
    creating at least one trench gap in the remaining semiconductor substrate from the thinned second surface;
    filling said at least one trench gap with dielectric layer;
    forming through-silicon vias, said through-silicon vias connecting the metal wiring embedded in the multilayer isolation structure; and
    forming a spiral inductor on the dielectric layer using at least one conductive layer wherein said spiral inductor has an inductor coil with more than one winding, the step of forming a spiral inductor on the dielectric layer comprises the formation of a metal wire embedded in the multilayer isolation structure, the formation of through-silicon vias, and the formation of a conductive layer on the dielectric layer, embedded in a passivation layer, said through-silicon vias and said metal wire defining at least one underpass and said conductive layer defining the inductor coil.

2. The method according to claim 1 wherein the carrier wafer is a high-ohmic silicon substrate having a resistivity in the range of 1 kOhm-cm to 10 kOhm-cm.

3. The method according to claim 1 wherein the carrier wafer is of dielectric material such as glass or of ceramic material such as sapphire.

4. The method according to claim 1 wherein the at least one trench gap created in the semiconductor substrate from the second surface extends to the multilayer isolation structure.

5. The method according to claim 4 wherein the dielectric layer filling the at least one trench gap is disposed also on the thinned second surface of the semiconductor substrate.

6. The method according to claim 1 wherein the material of the dielectric layer filling the trench gap is selected among the followings: Tetraethylorthosilicate (TEOS), spin-on glass (SOG), polyimide (PI), polybenzoxazole (PBO) or benzocyclobutene (BCB).

7. The method according to claim 1 wherein the spiral inductor formed on the dielectric layer is placed entirely within the region of the at least one trench-gap.

8. The method according to claim 1 wherein the through-silicon vias electrically connecting the spiral inductor to the metal wiring embedded in the multilayer isolation structure are placed entirely in said at least one trench gap filled with dielectric material.

9. The method according to claim 1 wherein the passivation layer may be selected among the followings: silicon oxide, low-k dielectric, spin-on dielectric such as polyimide (PI).

10. The method according to claim 1 wherein the thickness of said semiconductor substrate after the thinning step is less than 12 micrometers.

11. The method according to claim 1 wherein the thickness of said semiconductor substrate after the thinning step is less than 3 micrometers.

12. The method according to claim 1 wherein at least one bonding pad is disposed on the dielectric layer, said bonding pad being electrically connected to the metal wiring by said through-silicon vias.

13. The method according to claim 12 wherein the through-silicon vias providing an electrical connection of said bonding pad to the metal wiring are placed in a trench gap filled with the dielectric layer.

14. The method according to claim 1 wherein the step of forming through-silicon vias comprises the steps of: etching said through-silicon vias through the dielectric layer and through a portion of the multilayer dielectric by masked dry etch process, exposing the metal wiring at said through-silicon vias bottom, and filling said through-silicon vias—with conductive material.

15. The method according to claim 1 wherein said conductive layer is made of metal materials selected among the followings: Cu, Au, Al.

16. A product chip having an integrated spiral inductor fabricated with the method according to claim 1, comprising:
   a CMOS device circuit area comprising at least one MOS transistor;
   an area dedicated to the integrated spiral inductor; and
   an I/O area comprising at least one bonding pad;
wherein a trench gap is formed in the area dedicated to the spiral inductor where the silicon substrate is completely removed, said trench gap being filled with dielectric layer.

* * * * *